United States Patent
Ramesh et al.

[11] Patent Number: 5,493,712
[45] Date of Patent: Feb. 20, 1996

[54] FAST AGC FOR TDMA RADIO SYSTEMS

[75] Inventors: Nallepilli S. Ramesh, New Providence; Krishnamurthy Sreenath, Randolph Township, Morris County, both of N.J.

[73] Assignee: AT&T Corp., Murray Hill, N.J.

[21] Appl. No.: 216,371

[22] Filed: Mar. 23, 1994

[51] Int. Cl.⁶ .................................................... H04B 1/06
[52] U.S. Cl. .................................. 455/234.2; 455/235.1; 455/239.1; 455/245.2; 375/345
[58] Field of Search .......................... 455/234.1, 234.2, 455/235.1, 241.1, 244.1, 245.1, 245.2, 249.1, 251.1, 239.1, 250.1, 242.2; 330/136, 129, 184; 307/493; 375/345; 327/306, 331, 334, 350

[56] References Cited

U.S. PATENT DOCUMENTS

| | | | |
|---|---|---|---|
| 3,602,825 | 8/1971 | Senior | 307/493 |
| 4,393,513 | 7/1983 | Yokogawa | 455/249.1 |
| 4,829,593 | 5/1989 | Hara | 375/98 |
| 5,184,349 | 2/1993 | Riordan | 455/324.1 |
| 5,204,976 | 4/1993 | Baldwin et al. | 455/235.1 |
| 5,251,216 | 10/1993 | Marshall et al. | 375/98 |
| 5,276,685 | 1/1994 | Kepler et al. | 455/234.1 |

FOREIGN PATENT DOCUMENTS

0372759A2  11/1989  European Pat. Off. .

*Primary Examiner*—Edward F. Urban
*Assistant Examiner*—Thanh Le
*Attorney, Agent, or Firm*—Lester H. Birnbaum

[57] ABSTRACT

Disclosed is a circuit for automatic gain control (AGC) of random access channels (RACH) and traffic channels in a radio system. The amplitude of the input signal is detected at an intermediate frequency (IF) stage, digitized, and coupled to a digital signal processor (DSP) which produces an AGC signal for reducing the gain of the input when the input crosses a threshold value. For RACH bursts, the AGC signal tracks the input signal when it crosses the threshold and the AGC signal remains at a constant value for the the remainder of the time slot unless and until the input increases a threshold amount over its previous highest value. For traffic channels, the DSP will use the AGC signal from the RACH burst as an initial value and change the AGC signal only if the detected input is outside a predetermined range.

7 Claims, 3 Drawing Sheets

RANDOM ACCESS BURST

TRAFFIC BURST

TIME SLOT

FAST AGC FOR TDMA RADIO SYSTEMS

BACKGROUND OF THE INVENTION

This invention relates to time division multiple-access (TDMA) radiotelephone systems.

In radiotelephone systems, such as TDMA mobile phone systems, automatic gain control (AGC) is needed in the base stations to adjust for variations in amplitude of the incoming radio signals. In most systems, this is accomplished by detecting the signal at a baseband or intermediate frequency (IF) level and feeding it back to an attenuator at the IF portion of the station. (See, for example, U.S. Pat. No. 4,829,593 issued to Hara which utilizes a feedback loop for AGC, and also employs a feed forward portion to increase the dynamic range of a digital-to-analog converter.) While such an approach is generally adequate, certain systems, such as the Group Speciale Mobile (GSM), require a fast access time (generally less than 30 µsec) and, therefore, a fast automatic gain control which cannot be easily achieved with standard feedback circuits. The problem is exacerbated by the fact that the burst for a random access channel (RACH) has a time interval (typically less than 325 µsec) which is less than a time slot interval (generally approximately 577 µsec) and can appear at various positions in the time slot. Thus, it is difficult to detect the presence of a RACH burst and still provide a fast AGC.

Several proposals have been made to provide a fast AGC for time division multiplex access systems. For example, U.S. Pat. No. 5,184,349 issued to Riotdan suggests a combination of feedback and feed forward circuitry where the input signal is detected by producing a voltage proportional to the log of the amplitude. The resulting signal is digitized, and then applied to a control processor which adjusts a series of attenuators. The presence of a RACH burst is determined by the detected signal passing a certain threshold value. European Patent Application No. 0 372 759 A2 discloses a circuit where the input is detected at an IF stage, digitized, and used to control a gate for passing an AGC signal in a feedback loop to an IF amplifier. Again, the presence of a RACH burst is determined by passing a threshold value. The AGC value established for a RACH burst is also used as a preliminary value for the traffic bursts.

SUMMARY OF THE INVENTION

The invention is a circuit for providing automatic gain control in a radiotelephone system which receives signals in a succession of time slots. The circuit includes means for receiving an intermediate frequency input signal in an access time slot, means for detecting the amplitude of the signal and means for converting the amplitude of the detected signal to a digital representation.

The digital representation of the amplitude is coupled to means for providing an automatic gain control signal which is proportional to the amplitude of the detected signal only after the amplitude exceeds a first threshold level and which is kept at a first constant value until the end of the time slot unless the amplitude exceeds a second threshold level which is greater than the first, at which time the control signal is held at a second constant value greater than the first. Means are also provided for coupling the automatic gain control signal to at least one attenuator in the path of the intermediate input frequency signal so as to adjust the gain of that signal in a feed forward loop.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
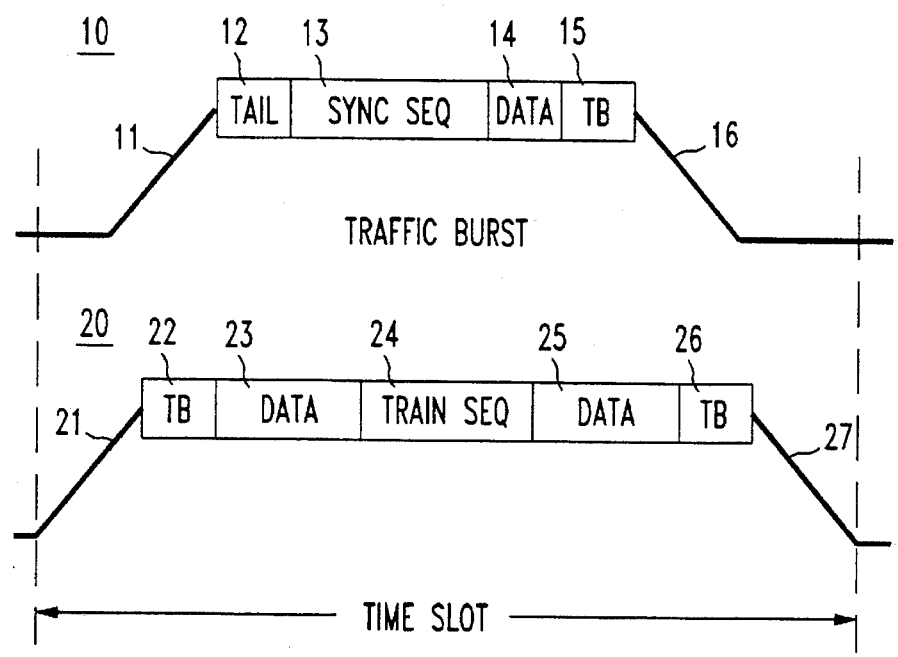
FIG. 1 is a block diagram illustrating a random access burst and a traffic burst in a TDMA radiotelephone system.

FIG. 1 illustrates the data burst format for the random access channel (RACH) 10 and the traffic channel (TCH) 20 in a GSM system. The duration of the time slot is illustrated by the vertical dashed lines and is approximately 577 µsec. The RACH burst 10 typically occurs at time slot zero of an 8-slot broadcast frame. After a duration for keying up to desired RF power (11), which is typically less than 30 µsec, the subscriber transmits 8 tail bits (12). It is during the interval of the tail bit section 12 that automatic gain control (AGC) is effected. The tail section 12 is followed by a sequence of 41 synchronized bits in section 13. This section is used for clock recovery and to determine propagation delay of the burst. The data section 14 includes 36 bits of information about the user. The data section is followed by another tail bit section 15, this one having only 3 bits, and a duration 16 for keying down which is, again, less than 30 µsec.

The traffic burst 20 would normally occur in any of the time slots in the frame other than time slot zero. The traffic burst also includes an interval 21 for keying up, and a tail bit section, 22, which in this case is only 3 bits. Data sections 23 and 25 are each 58 bits and are separated by a training sequence, 24, consisting of 26 bits which serve to determine distortion on the channel. The data is followed by another tail section, 26, and an interval, 27, for keying down.

It will be noted that, while the traffic burst 20 fully occupies a time slot, the RACH burst is shorter (approximately 325 µsec) and can occur at any portion of the slot. This makes detection of the burst difficult. Also, AGC must be done in a fairly short period of time (30 µsec for RACH).

Figure 2:
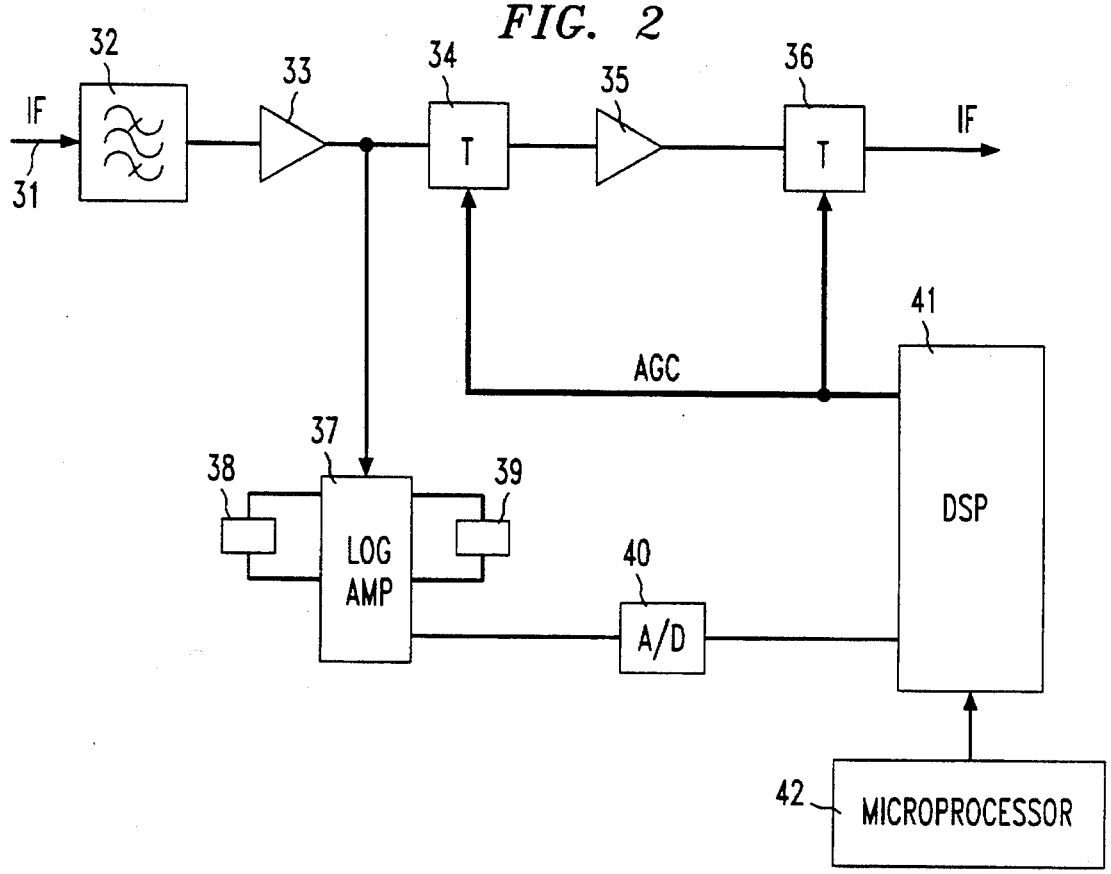
FIG. 2 is a schematic circuit diagram of a circuit in accordance with an embodiment of the invention.

FIG. 2 illustrates a circuit for accomplishing AGC in accordance with an embodiment of the invention. Conductor 31 couples an intermediate frequency (IF) signal which is representative of the radio frequency (RF) signal received by the base station. The conductor 31 is coupled to a bandpass filter 32 which, in this example, passes a frequency of approximately 86 MHz. The bandpass filter is coupled to an amplifier 33. The output of amplifier 33 is split into two branches. One branch constitutes the main receive path for the signal and includes a first attenuator 34, an amplifier 35, and a second attenuator 36.

The second branch comprises the AGC feed forward path. This path includes a logarithmic (log) amplifier 37. In this example, the log amplifier comprises a receiver integrated circuit, a crystal oscillator 38 operating at 96.7 MHz, and a 10.7 MHz filter 39. The log amplifier is coupled to an analog-to-digital (A/D) converter 40 which is, in turn, coupled to a digital signal processor (DSP) 41. The feed forward path is completed by coupling the DSP 41 to the attenuators 34 and 36 in the main receive path. The DSP 41 also receives instructions from a microprocessor 42 located in a different portion of the base station.

Figure 3:
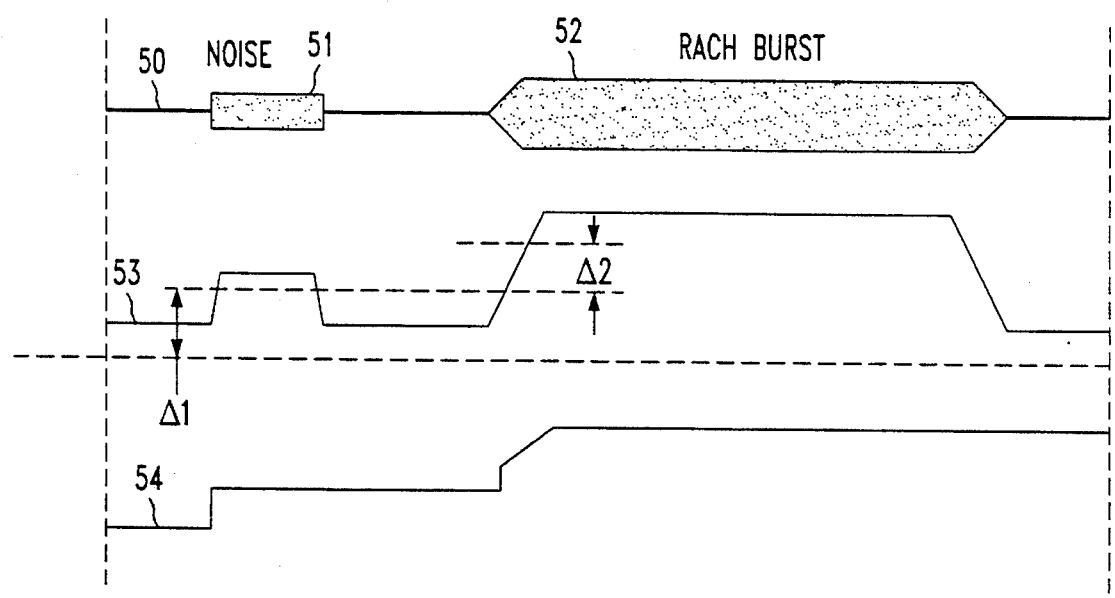
FIG. 3 illustrates various signal waveforms applicable to the circuit of FIG. 2.
Figure 4:
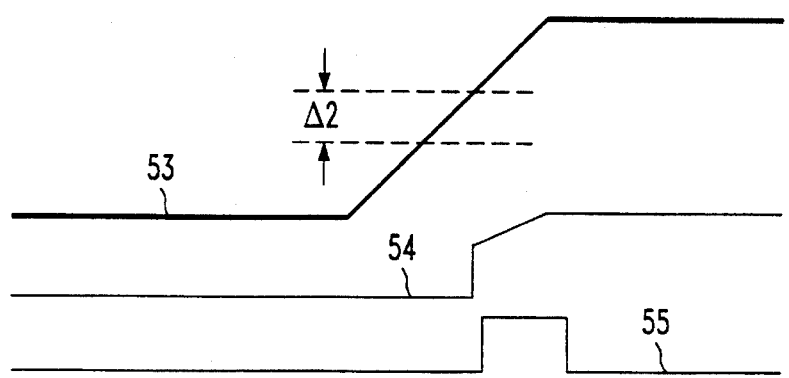
FIG. 4 is a magnified view of a portion of the waveforms of FIG. 3.

The operation of the circuit of FIG. 2 will now be described with further reference to the waveforms of FIGS. 3 and 4. FIG. 3 illustrates signals during a particular time slot indicated by the vertical dashed lines.

Conductor 31 of the circuit receives an input signal of the type illustrated by waveform 50 during an access time slot. For purposes of illustration, the RACH burst 52 is shown preceded by a noise burst 51. It will be appreciated that a noise burst may not be present, or, if present, can also occur after the RACH burst.

The input signal is amplified by amplifier 33 and coupled to log amp 37. Log amp 37 reduces the frequency, in this example, to 10.7 MHz by generating a 96.7 MHz signal from the crystal oscillator 38 and mixing it with the incoming 86 MHz signal from amplifier 33. The log amp then detects the root mean square (RMS) amplitude of the signal and produces an output signal which is proportional to the log of the amplitude of the input signal. A logarithmic response is desirable since the input signal can vary over a wide range (typically 90 dB). The detected signal is then digitized by analog-to-digital converter 40 and fed to the DSP 41.

The DSP 41 examines the amplitude of the detected signal (illustrated by curve 53 prior to digitization) and produces an AGC signal (curve 54) in response to an increase in the detected signal above a first threshold ($\Delta 1$). The initial threshold is set based on the input signal level appropriate to provide maximum gain and, in one example, is approximately −100 dBm. This elevated AGC signal is sent to the attenuators 34 and 36 to reduce the gain in response to the detected signal from the first burst (noise burst 51).

The AGC signal (curve 54) will then be held at the elevated level until the end of the time slot even when the burst 51 disappears, unless, as shown here, a second burst of sufficient amplitude (RACH burst 52) appears in the time slot. Specifically, the incoming burst would have to produce an amplitude in the detected signal (curve 53) which is some predetermined amount above the initial threshold ($\Delta 1$). Typically, the second or subsequent threshold ($\Delta 2$) would be twice the previous threshold. If the detected signal reaches the second or subsequent threshold, the DSP 41 initiates a window timer, illustrated by curve 55 of FIG. 4, which is set for a time corresponding to the rise time of a burst (typically 20 μsec). While the timer is set, the DSP will track the amplitude of the detected signal with the AGC signal. The AGC signal will then be held to its peak value until the end of the time slot. (It will be noted that the window timer was also set, and the AGC tracked to the detected signal, when the noise burst appeared, but this was not illustrated since the amplitude of the detected signal above the first threshold was small.)

It will be appreciated, therefore, that by holding the AGC signal at a peak value until an initial threshold is exceeded by a certain amount, the circuit of FIG. 3 can prevent small variations in the detected signal from altering the gain. By also utilizing the tracking window once the initial threshold signal is exceeded by the predetermined amount, the final RACH burst amplitude can be accounted for by the AGC signal.

Figure 5:
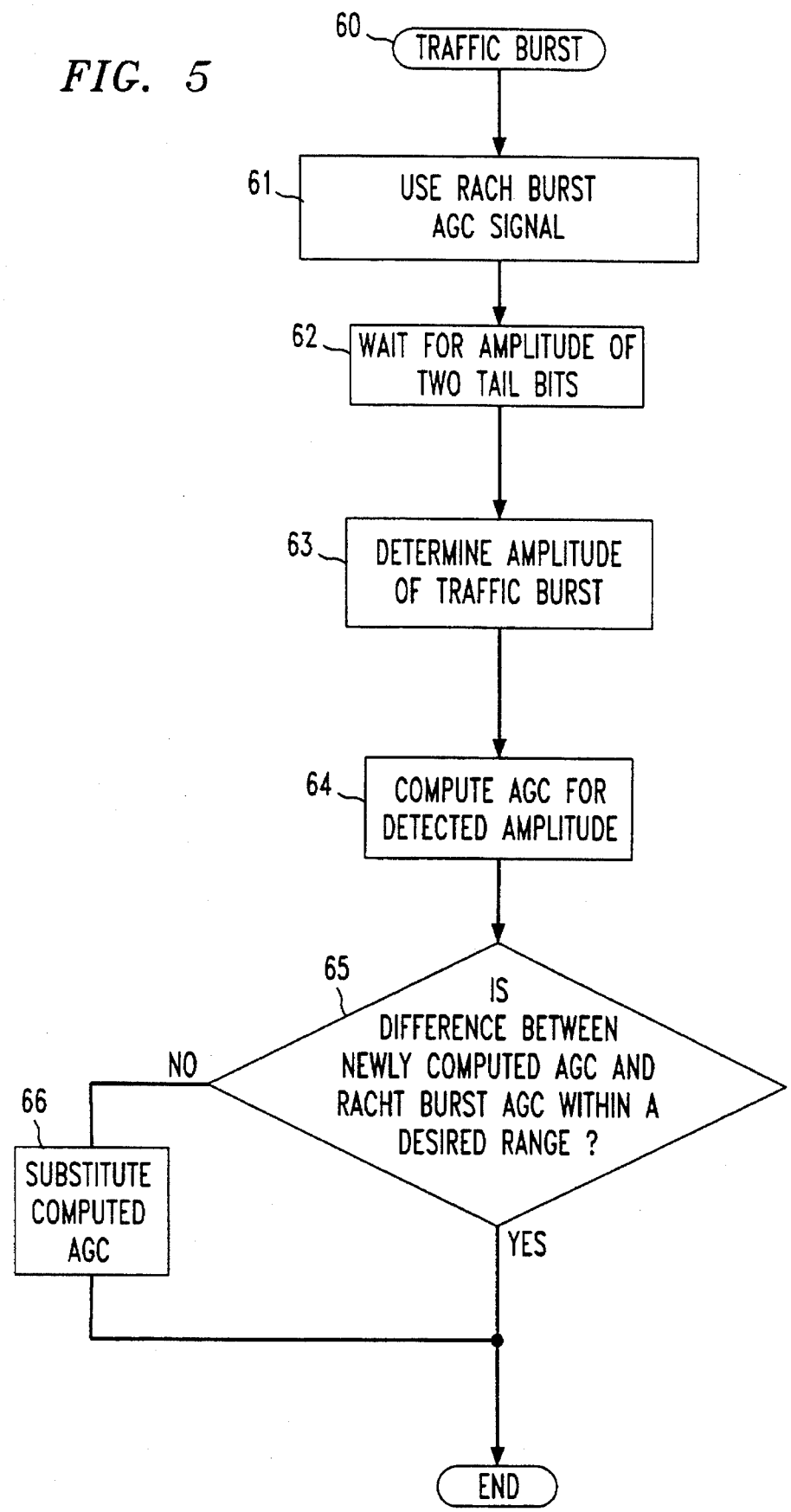
FIG. 5 is a flow diagram illustrating a portion of the operation of the invention.

The peak value of the AGC signal achieved during a RACH burst can be used in establishing the AGC signal in later time slots where normal traffic bursts are received. As illustrated by the flow diagram of FIG. 5, when a traffic burst appears, step 60, the DSP uses the peak signal from the RACH burst as the initial AGC signal value for the first traffic time slot (step 61). The DSP then waits (step 62) and monitors the amplitude of the incoming signal for tail section 22 of the traffic channel burst as determined by the log amp 37 and A/D converter 40 (step 63). The DSP computes an AGC for the detected amplitude (step 64) in the manner previously described and compares this computed AGC with the initial AGC signal determined from the RACH burst (step 65). If the difference tails within an allowable range, the initial AGC signal value from the RACH burst will continue to be used. If not, the newly computed AGC value will be substituted in the next traffic time slot.

These measurements and comparisons for the traffic bursts can be done at the beginning of every time slot if desired.

The DSP is informed as to which time slots are allocated for RACH and traffic bursts by the microprocessor 42 which is typically located at some other area of the base station.

Various modifications of the invention will become apparent to those skilled in the art. All such variations which basically rely on the teachings through which the invention has advanced the an are properly considered within the scope of the invention.

We claim:

1. A circuit for providing automatic gain control in a radiotelephone system which receives signals in a succession of time slots which system includes at least one random access time slot in a broadcast frame also including traffic time slots, the circuit comprising:

means for receiving an intermediate frequency input signal in the access time slot;

means for detecting the amplitude of the input signal;

means for converting the amplitude of the detected signal to a digital representative;

means coupled to the converting means for providing an automatic gain control signal in said access time slot which is proportional to the amplitude of the detected signal only after the said amplitude exceeds a first threshold level and which is kept at a first constant value until the end of the access time slot unless the said amplitude exceeds a second threshold level which is greater than the first threshold level and, in that event, the gain control signal is held at a second constant value greater than the first constant value until the end of the access time slot;

means for coupling the automatic gain control signal to at least one attenuator in the path of the immediate input frequency signal so as to adjust the gain of that signal in a feed forward loop;

means for comparing a second automatic gain control signal derived from an input signal from a subsequent traffic time slot with the automatic gain control signal value derived from the access time slot, and substituting the second automatic gain control signal in the event that the difference between the two automatic gain control signal values falls outside a predetermined range.

2. The circuit according to claim 1 wherein the means for detecting the amplitude comprises a logarithmic amplifier which produces an output signal proportional to the log of the amplitude of the input signal.

3. The circuit according to claim 2 wherein the logarithmic amplifier comprises a receiver circuit, a crystal oscillator, and a filter.

4. The circuit according to claim 1 wherein the means for providing an automatic gain control signal comprises a digital signal processor.

5. The circuit according to claim 4 wherein the DSP triggers a window timer in the event the first or second threshold level is exceeded, during which time the gain control signal is increased proportionally to the input signal, the timer being set for a time corresponding to the rise time of the input signal.

6. The circuit according to claim 1 wherein the second threshold level is set to at least twice the first threshold level.

7. The circuit according to claim 1 wherein the means for comparing is coupled to a microprocessor in order to determine if the input signal is from an access time slot or a traffic time slot.

* * * * *